United States Patent
Chin et al.

(10) Patent No.: US 8,377,797 B1
(45) Date of Patent: Feb. 19, 2013

(54) METHOD FOR BONDING OF SEMICONDUCTOR COMPONENT TO A SUBSTRATE

(75) Inventors: Aland K. Chin, Sharon, MA (US); Jonah H. Jacob, Brookline, MA (US); Maciej Thomas Knapczyk, Cambridge, MA (US)

(73) Assignee: Science Research Laboratory, Inc., Somerville, MA (US)

( * ) Notice: Subject to any disclaimer, the term of this patent is extended or adjusted under 35 U.S.C. 154(b) by 135 days.

(21) Appl. No.: 12/844,064

(22) Filed: Jul. 27, 2010

Related U.S. Application Data (60) Provisional application No. 61/229,150, filed on Jul. 28, 2009.

(51) Int. Cl.
*H01L 21/30* (2006.01)

(52) U.S. Cl. .... 438/455; 438/664; 257/758; 257/E21.51

(58) Field of Classification Search .................. 438/455, 438/664; 257/758
See application file for complete search history.

(56) References Cited

U.S. PATENT DOCUMENTS

| | | | |
|---|---|---|---|
| 3,252,722 A | 5/1966 | Allen | |
| 3,921,885 A | 11/1975 | Knox | |
| 4,077,558 A | 3/1978 | Carlson et al. | |
| 5,197,654 A * | 3/1993 | Katz et al. | 228/124.1 |
| 6,399,182 B1 * | 6/2002 | Rubel et al. | 428/167 |
| 7,439,551 B2 * | 10/2008 | Hata | 257/98 |
| 7,863,717 B2 * | 1/2011 | Chan et al. | 257/676 |
| 2002/0025256 A1 * | 2/2002 | Caren | 417/53 |
| 2006/0035438 A1 * | 2/2006 | Cunningham | 438/455 |
| 2009/0092162 A1 * | 4/2009 | Huff et al. | 372/36 |
| 2009/0137082 A1 * | 5/2009 | Kurita | 438/106 |
| 2009/0206456 A1 * | 8/2009 | Guth et al. | 257/666 |
| 2009/0286382 A1 * | 11/2009 | Huff | 438/455 |
| 2010/0052112 A1 * | 3/2010 | Rogers et al. | 257/625 |
| 2012/0025256 A1 * | 2/2012 | Kususe et al. | 257/98 |

OTHER PUBLICATIONS

Lee, C. C. et al. A New Gold-Indium Eutectic Bonding Method, Mat. Res. Soc. Symp. Proc. vol. 264, 1992.
Lee, C. C. et al. Au—In Bonding Below the Eutectic Temperature, IEEE Transactions on Components, Hybrids, and Manufacturing Technology, vol. 16, No. 3, May 1993.
So, W. W. et al. Fluxless Process of Fabricating In—Au Joints on Copper Substrates, IEEE Transactions on Components and Packaging Technologies, vol. 23, No. 2, Jun. 2000.

* cited by examiner

*Primary Examiner* — A. Sefer
(74) *Attorney, Agent, or Firm* — Burns & Levinson LLP; Jerry Cohen; Orlando Lopez (57) ABSTRACT

A method of attaching a semiconductor component to a heat-sink where the component is first placed onto a heat-sink substrate whose attachment surface comprises a malleable-metal film, a semiconductor component is placed onto the malleable-metal film, and pressure and heat is applied for a predetermined time to the stack including substrate with malleable-metal film and semiconductor component.

37 Claims, 5 Drawing Sheets

METHOD FOR BONDING OF SEMICONDUCTOR COMPONENT TO A SUBSTRATE

CROSS REFERENCE TO RELATED APPLICATIONS

This application claims priority under 35 U.S.C. §119 from U.S. Provisional Patent Application No. 61/229,150, entitled METHOD FOR BONDING OF SEMICONDUCTOR COMPONENT TO A SUBSTRATE, filed on Jul. 28, 2009, which is incorporated in its entirety herein by reference for all purposes.

BACKGROUND

There are numerous situations in which a semiconductor component is bonded to a substrate. In one common example, the semiconductor component is bonded or attached to a thermally conductive heat sink. In order to extract waste heat generated during device operation and to provide electrical contact, semiconductor components are attached to a thermally conductive heat sink substrate, usually by a means of a solder. The surface of the substrate is metalized to allow adhesion of the solder if the substrate is not composed of a metal. The surface of the substrate is generally metalized to control the interaction between the solder and the substrate.

Failure of semiconductor components is accelerated in part by mechanical stress. One source of stress results from the different coefficient-of-thermal-expansion (CTE) between the material of the semiconductor component and the material of the substrate. At temperatures where the solder is molten, the mechanical stress is insubstantial. Once the temperature decreases below the melting temperature of the solder, the substrate applies a mechanical stress on the component that is proportional to the difference in the CTE of the semiconductor and the substrate as well as the difference between the melting temperature of the solder and the temperature of the component.

There are several procedures to minimize the mechanical stress on the component due to the soldering process:
  a. Choose a substrate whose CTE is close in value to the CTE of the semiconductor component
  b. Choose a solder with a low melting temperature
  c. Choose a solder that remains malleable in the solid form.

One factor to be considered in the first procedure is that substrate materials, e.g. molybdenum (Mo) and copper-tungsten ($Cu_{10}W_{90}$), whose CTE is close in value to the CTE of common semiconductor components, e.g. silicon (Si), gallium arsenide (GaAs), and indium phosphide (InP), have relatively poor values of thermal conductivity (TC) relative to copper or diamond. The performance and reliability of a semiconductor component decreases with increasing temperature. Substrates with lower values of TC result in higher operating temperatures for semiconductor components.

Some of the factors to be considered in the second and third procedure are:
  a. The melting temperature of the solder, e.g. indium, is sufficiently high (156° C.) to result in a significant mechanical stress
  b. Malleable solder migrates under thermal cycling, spatial variations of temperature and electrical current
  c. Molten solder reacts uncontrollably with the metallization of the semiconductor component or the substrate, often resulting in compounds or alloys with undesirable material properties.
  d. The melting of solder reduces the thickness precision of the bond.
  e. Molten solder may wick There is a need for improved methods for bonding that introduce less mechanical stress.

BRIEF SUMMARY

In one embodiment, the method of these teachings for attaching a semiconductor component to a metallized substrate includes disposing a thin film of malleable metal onto a surface of the metallized substrate, disposing the semiconductor component on to the surface of the metallized substrate onto which the thin film was disposed and applying a predetermined pressure between a top surface of the semiconductor component and a bottom surface of the metallized substrate for a predetermined period of time. In one instance the semiconductor component surface that is disposed on the surface of the metallized substrate is preconditioned. Preconditioning can include machining, polishing, and altering the surface metallurgy. The altering of the surface metallurgy can include depositing thin metal layers such as adhesion layers, diffusion barriers and oxidation protection layers. In another instance, the metallized substrate surface on which the layer of malleable material is disposed is preconditioned. Preconditioning can include machining, polishing, and altering the surface metallurgy.

In another embodiment, the method of these teachings for attaching a semiconductor component to a metallized substrate includes a semiconductor component, thereby forming a first structure, disposing a thin film(s) of a malleable metal onto a metallized substrate, thereby forming a second structure, disposing the first structure on to the second structure, the semiconductor component being disposed onto the thin film of the malleable metal, and thereby forming a third structure, and applying a predetermined pressure and providing a predetermined quantity of heat to the third structure for a predetermined period of time, the predetermined quantity of heat raising the temperature of the third structure to a temperature higher than ambient temperature but lower than the melting temperature of any of the materials of the third structure. The predetermined pressure is selected to cause plastic deformation of the malleable metal(s) and promote intimate physical contact with the adjacent surface. The predetermined time and the predetermined pressure are selected so that the malleable metal(s) interact with the adjacent semiconductor component layer. In one instance, the interaction between the malleable metal(s) disposed on the substrate includes the forming of a compound or alloy with the metal on the semiconductor component.

In one instance, the metallized substrate includes a metal substrate (in that instance, a metallized substrate refers to the metal substrate). In another instance, the metallized substrate includes one or more thin-film layers of metallization disposed on a surface of the substrate on which the thin-film of the malleable metal is later disposed on. In that instance, the thin-film of the malleable metal is disposed on the outermost thin-film layer of metallization (each subsequent thin-film layer of metallization, after the first thin-film layer of metallization, being disposed on a previous thin-film layer of the metallization). In a further instance, one or more other layers of metallization are disposed on the surface of the semiconductor component that will be eventually disposed on the thin-film of the malleable metal. In that further instance, the one or more other layers of metallization are eventually disposed between the semiconductor component and the thin-film of the malleable metal.

In one instance, the present teachings are based on diffusion bonding, or therm-compression welding, of two dissimilar metals, of which one has a significantly lower melting temperature. The bonding process is conducted without melting any of the metals, at temperature higher than room temperature to promote interfacial material interaction. Some pressure is applied to bonding surfaces to cause plastic deformation and promote intimate physical contact between surfaces. (In one instance, these teachings, not to be limited only to that instance, concerning the promotion of intimate physical, contact includes the reduction of voids.) In one instance, not a limitation of these teachings, the bond formation process includes metal diffusion resulting in the formation of an alloy or compound. In one embodiment, these teachings not being limited only to that embodiment, the alloy or compound formed has a melting temperature higher than that of the original metals.

In one instance, in order to assure even distribution of the bonding force perpendicular to the bonded surfaces and compensate for any tooling misalignment, a thin, soft preform (first malleable metal) is placed on top of the semiconductor component (a laser diode chip in one instance). The preform, as it deforms, distributes the force uniformly over the semiconductor component (in one instance a laser diode chip) area, and bonds to the electrode of the semiconductor component, becoming a permanent part of the assembly.

In yet another embodiment, an adhesion promoting thin film is first deposited on the same surface of the metallized substrate on which the thin film of the malleable metal is eventually deposited, a diffusion barrier thin-film is then deposited on the adhesion promoting thin film, and the thin-film of the malleable metal is deposited on the adhesion promoting thin film. In other embodiments the semiconductor component has one or more metallization layers (thin films) disposed both on the surface on which the thin-film of the first malleable material is deposited and on the surface of the semiconductor component that is disposed onto the thin-film of the malleable material.

In one embodiment, the method of these teachings for increasing semiconductor junction component lifetime includes diffusion bonding the semiconductor junction component to a heat removal component where the diffusion bonding is accomplished by one of the embodiments of the bonding method of these teachings.

For a better understanding of the present teachings, together with other and further needs thereof, reference is made to the accompanying drawings and detailed description and its scope will be pointed out in the appended claims.

DETAILED DESCRIPTION

Embodiments of methods for diffusion bonding of a semiconductor component to a metal substrate and products made by those methods are disclosed herein below. Although the methods are disclosed by means of exemplary embodiments, it should be noted that these teachings are not limited only to those exemplary embodiments, that numerical values are given below for illustration and that these teachings can be practiced as a large range of conditions, including those given below in terms of numerical values but not limited to only those given below.

Figure 1:
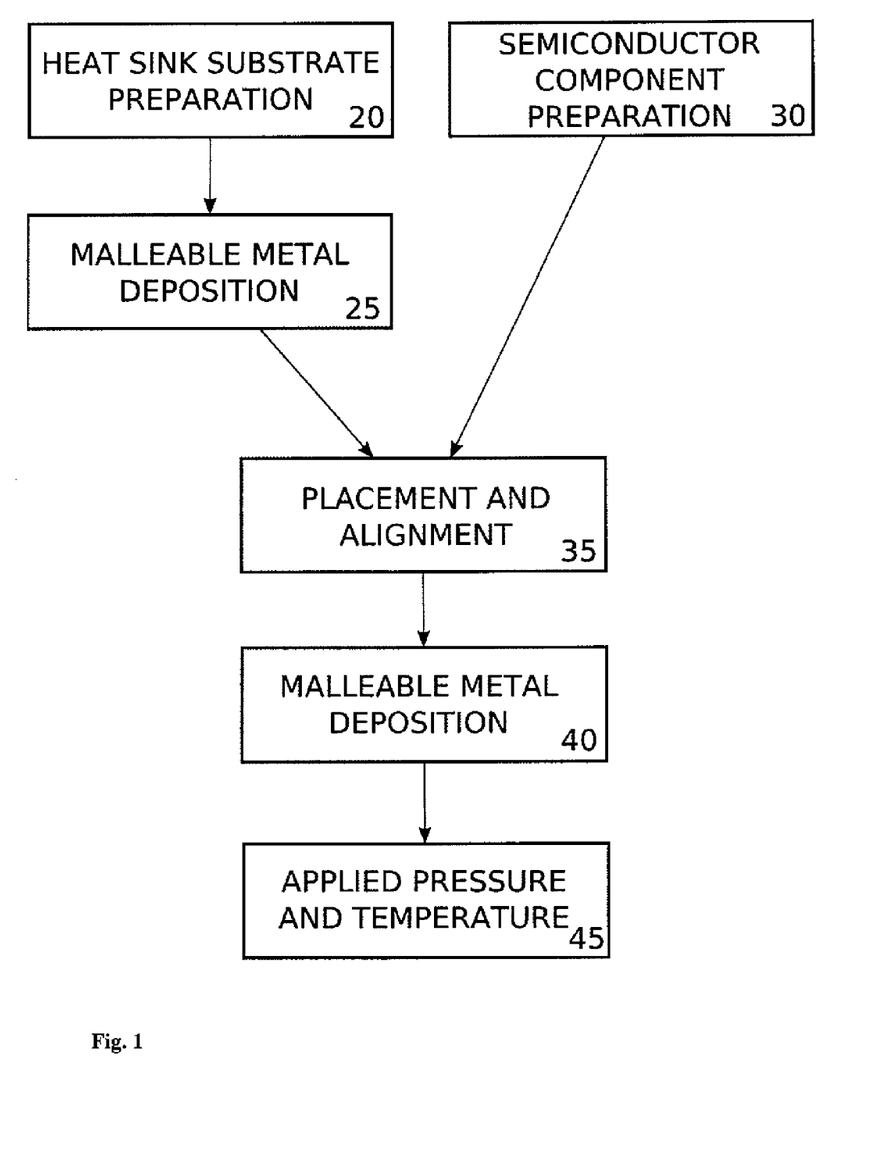
FIG. 1 illustrates a flowchart representation of one embodiment of the method of these teachings resulting in a solder-less bond.

FIG. 1 depicts an embodiment of the method of these teachings for thermo-compression bonding, where a semiconductor component is attached to a metallized substrate (a heat sink in one embodiment, hereinafter referred to as a heat sink, the steps disclose being also applicable to any metallized substrate), without use of traditional soldering techniques. The metallized substrate (heat sink substrate) preparation (step 20, FIG. 1) can include, in one instance, of the following steps:

a. machining
b. polishing
c. surface metallurgy

The machining step produces desired geometry of the heat sink and heat sink surface, and polishing results in surfaces flat and smooth enough to perform the bonding. Surface metallurgy prepares the surfaces for the bonding process by depositing thin metal layers—adhesion and diffusion barrier. Then, a final layer of malleable metal is deposited on top of the heat sink (step 25, FIG. 1), in preparation for the bonding process.

The specific steps of semiconductor component preparation (step 30, FIG. 1) will depend on the particular kind of component that is to be bonded, but in general could include:

a. material growth and die fabrication and die cutting (conventionally performed)
b. top surface metallurgy
c. bottom surface metallurgy.

In general, layers having similar function (adhesion, diffusion barrier and bonding) may be deposited on both the surface of the semiconductor component to be bonded and the surface of the heat-sink. The semiconductor component, after preparation, is then placed on top of the heat sink (metallized substrate) with malleable metal (step 35, FIG. 1).

Figure 2:
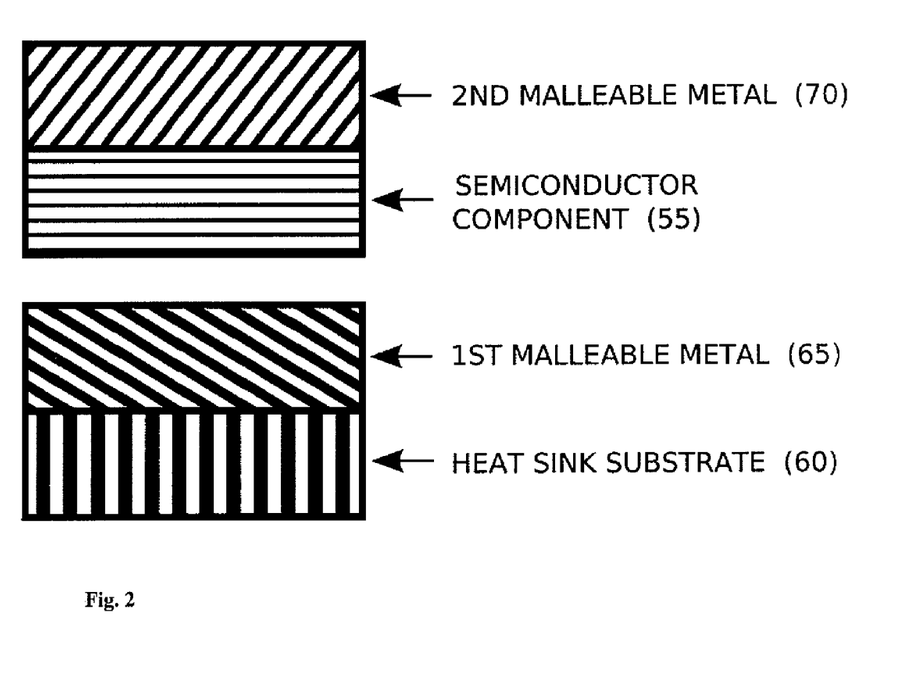
FIG. 2 is a graphical schematic representation of a cross-sectional view of one embodiment of an assembly produced by an embodiment of the method of these teachings, before the bonding process

This assembly is schematically presented in FIG. 2. After the assembly of FIG. 2 is obtained, the top sub-assembly (the semiconductor component) 55 (with the second malleable metal 70 disposed on the top surface) is placed on the bottom subassembly (the heat sink 60 with the thin-film of a malleable metal 65 disposed on a top surface) and a temperature is applied to the entire assembly and pressure is exerted perpendicularly to the surface of the semiconductor component. The pressure exerted is selected so that it causes plastic deformation of the malleable material and promotes intimate contact between surfaces. The temperature is selected so that it is above room temperature but below the lowest melting temperature of the materials involved. As a result, the metallization of the bottom surface of semiconductor component forms metallurgical bond with the malleable metal.

In one exemplary embodiment of the proposed method, a laser diode die was diffusion-bonded to a copper heat sink. The assembly, before the bonding, is presented in FIG. 3. The surface of a conventional heat sink (1) was prepared by sputter-depositing about 100 Å of Titanium (Ti) (2), which acts as an adhesion layer, and about 1000 Å of Platinum (Pt) (3) which acts as diffusion barrier. The surface of the heat sink was subsequently coated with about 2 µm-thick layer of Indium (In) (4), which promotes the diffusion bonding and acts as the malleable material. It should be noted that although, in this exemplary embodiment including one or more thin-film layers of metallization disposed on a surface of the substrate and one or more other layers of metallization are disposed on the surface of the semiconductor component, specific dimension and materials are described, these teachings are not limited only to this exemplary embodiment and other dimensions and materials are also within the scope of these teachings.

Figure 3:
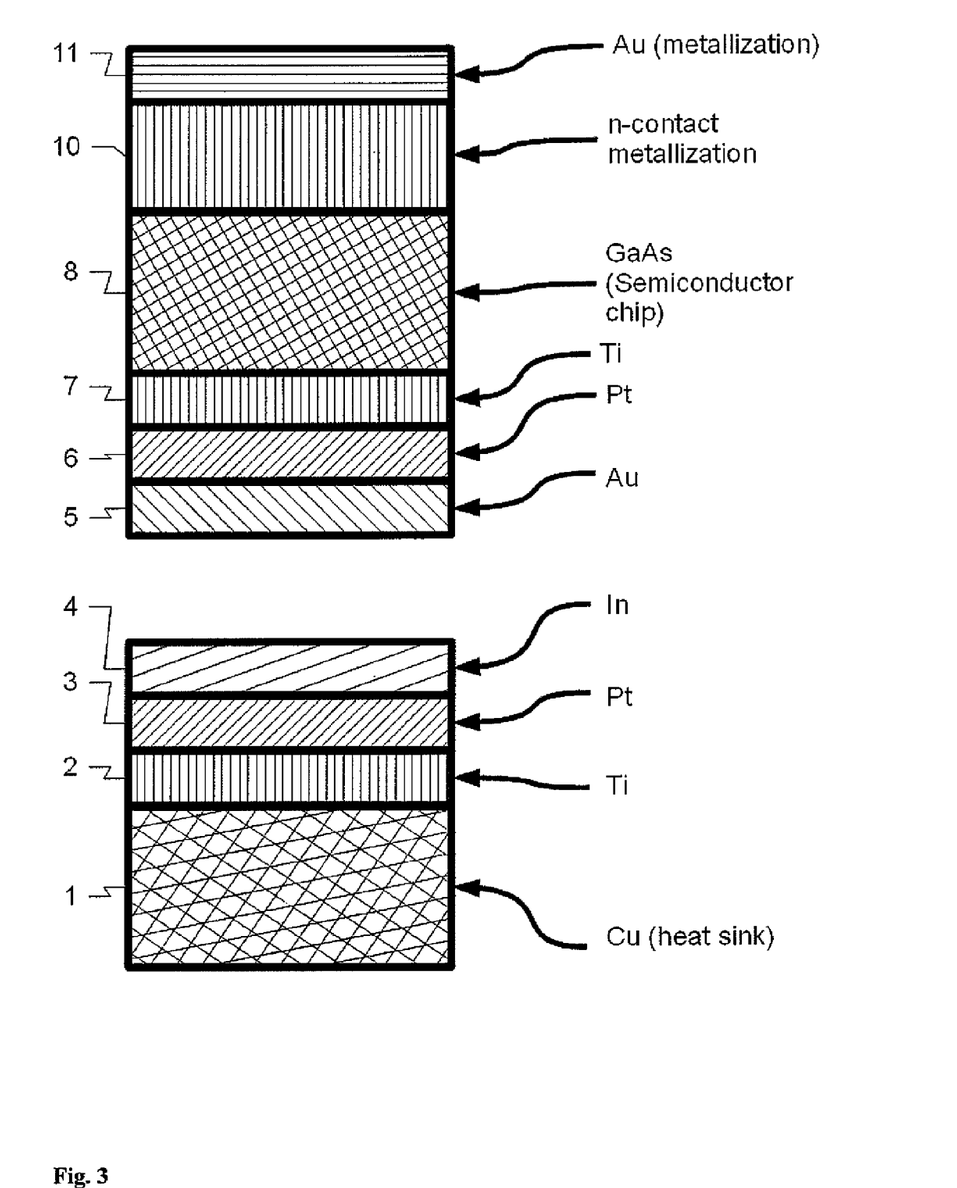
FIG. 3 is a graphical schematic representation of a cross-sectional view of one embodiment of the semiconductor and metallic layers of an assembly produced by embodiment of the method of these teachings, before pressure and heat is applied.

In the exemplary embodiment, a conventional Gallium Arsenide (GaAs) laser diode die (8) with a final external layer of gold (5, 11), on top and bottom surfaces was used for the diffusion bonding process. The stacking of the assembly was performed in the following steps: first, the laser diode chip was placed on top of the heat sink assembly. In some embodiments, a top gold layer (preform) 12 is also utilized. The preform layer 12 (or in one instance of the external gold layer 11) acts as first malleable material that uniformly distributes the downward force applied to the assembly. It should be noted that these teachings are not limited to the dimension, materials and devices utilized in the exemplary embodiment and other dimension, materials and devices are within the scope of these teachings.

In some embodiments, adhesion layer 7 and a diffusion barrier 6 are deposited on the bottom surface of the semiconductor component 8 before depositing the bottom and malleable material (in this exemplary embodiment, gold) layer 5.

In this exemplary embodiment, these teachings not being limited only to the exemplary embodiment, the bonding process was performed using a conventional die bonder device, which allows for precise alignment of the bonded components and application of uniform downward force and maintaining desired temperature of the assembly, in the presence of forming gas (5% $H_2N_2$).

Figure 4:
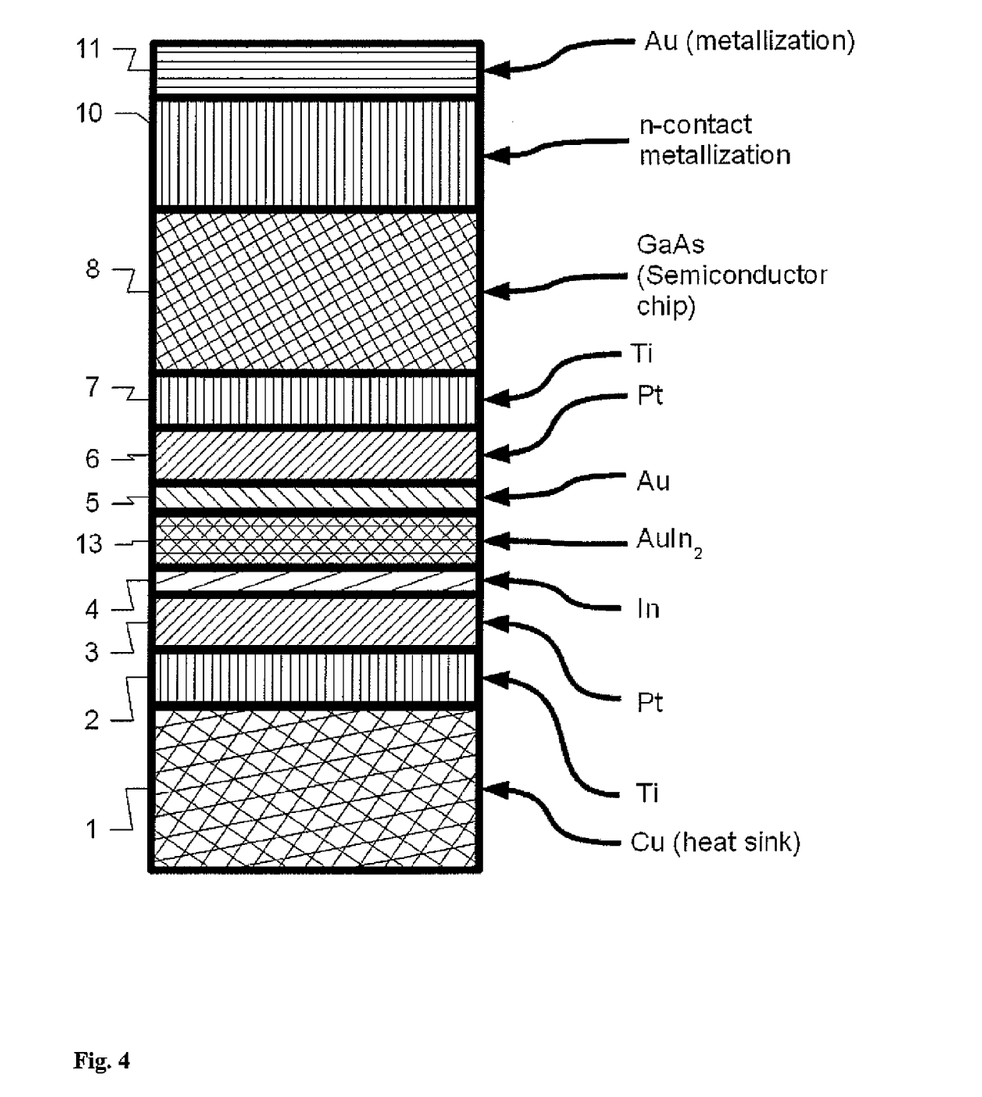
FIG. 4 is a cross-sectional view of one embodiment of all the layers of the assembly produced by the method of these teachings, after diffusion bonding is completed.

During the bonding, in the exemplary embodiment, the assembly is heated to about 75° C.-a temperature lower than the melting point of indium (156° C.), but high enough to promote metal inter-diffusion. The compression force was adjusted proportionally to the area of the laser diode chip, so that the amount of force per unit area was on the order of 2 kg/mm$^2$, however lower or higher forces are within the scope of these teachings. When the pressure perpendicular to the bonded surfaces is applied, it causes the semiconductor component (in one instance, with thin film layers disposed thereon) and the metallized substrate with the malleable metal layer disposed thereon to come in intimate physical contact and elevated temperature and promotes interdiffusion of metals (indium-gold). The force and temperature is applied for approximately 10 minutes, after which the laser diode chip is bonded to the substrate (heat sink). There is a time-temperature relationship determined by the inter-diffusion process whereby one can choose to apply the force for a longer time and lower temperature. When the bonding process is complete, it yields a structure presented in FIG. 4, with an AuIn$_2$ interface layer (13). In one instance, these teachings not be limited to only that instance, the AuIn$_2$ interface layer (13) has the melting temperature of approximately 541° C., which is higher than the melting point of In alone.

In one embodiment, the method of these teachings for attaching a semiconductor component to a metallized substrate includes a semiconductor component, thereby forming a first structure, disposing a thin film of a second malleable metal onto a metallized substrate, thereby forming a second structure, disposing the first structure on to the second structure, the semiconductor component being disposed onto the thin film of the malleable metal, and thereby forming a third structure, and applying a predetermined pressure and providing a predetermined quantity of heat to the third structure for a predetermined period of time, the predetermined quantity of heat raising the temperature of the third structure to a temperature higher than ambient temperature but lower than a low melting point temperature. The predetermined pressure is selected to cause plastic deformation and promote intimate physical contact between surfaces. The predetermined time and a predetermined pressure are selected so that the malleable metal and the adjacent layers interact. In one instance, time-temperature relationship is determined by the inter-diffusion process whereby one can choose to apply the force for a longer time and lower temperature. In some instances, in the interaction between the thin film of the malleable metal and the semiconductor component (or in one embodiment, a film deposited on the semiconductor component) includes the diffusion of metals so that an alloy is formed.

The term metallized substrate, as used herein, includes a metal substrate on which thin films of metal has been deposited. In one embodiment, the metallized substrate includes one or more thin-film layers of metallization disposed on a surface of the substrate on which the thin-film of the malleable metal is later disposed on. In that embodiment, the thin-film of the malleable metal is disposed on the outermost thin-film layer of metallization (each subsequent thin-film layer of metallization, after the first thin-film layer of metallization, being disposed on a previous thin-film layer of the metallization). In a further embodiment, one or more other layers of metallization are disposed on the surface of the semiconductor component that will be eventually disposed on the thin-film of the malleable metal. In that further instance, the one or more other layers of metallization are eventually disposed between the semiconductor component and the thin-film of the malleable metal.

In one instance the thin film of the malleable metal has a Young's modulus of less than 80 GPa, such as, but not limited to, as in a thin film comprising gold. In another instance, the thin film of the malleable metal has a young modulus of less than 30 GPa, such as, but not limited to, as in a thin-film comprising indium. In some instances, the root mean square surface roughness of the metal substrate is at most 1000 angstroms (Å). In other instances, the curvature of the metal substrate is at most equal to 2 m. In still another instance, the applied pressure is more than 1 MPa (0.1 kg/mm$^2$) and less than 100 MPa (10 kg/mm$^2$). In other instances, the applied pressure is more than 2 MPa (0.2 kg/mm$^2$) and less than 100 MPa (10 kg/mm$^2$). In some instances, the predetermined quantity of heat results in a stack temperature of more than 50° C. and less than the melting temperature of either the thin film of the first malleable metal or the melting temperature of the thin film of the second malleable metal. In one instance, the predetermined time is more than one second and less than 30 minutes. In one embodiment, the predetermined pressure and the predetermined quantity of it are applied simultaneously. In another embodiment, the predetermined pressure is applied before the predetermined quantity of heat is applied. In yet another embodiment, the predetermined quantity of heat is applied before the pressure is applied. In one embodiment, the thin film of the second malleable metal is deposited onto the substrate using conventional deposition techniques. In a different embodiment, the thin film of the second malleable metal is placed onto the substrate. In one embodiment, the method of these teachings includes removing organic contamination from the thin film of malleable metal by exposing the thin films to an appropriate cleansing environment including electromagnetic radiation such as, but not limited to, ultraviolet (UV) electromagnetic radiation or a conventional oxygen plasma. In one instance, and the length and width of the thin film of the first malleable metal are at most equal to the length and width of the semiconductor component. In another instance, the length and width of the thin-film of the malleable metal are at least equal to (substantially equal to or more than) the length and width of the semiconductor component. The thickness of the thin-film of the malleable metal, in some instances, is selected to be equal to or more than five times the root mean square surface roughness of the surface it is disposed on.

Figure 5:
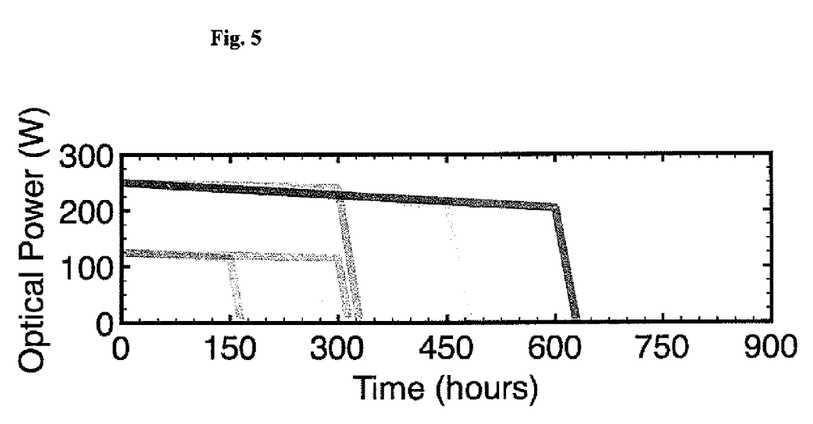
FIG. 5 depicts results of increased lifetime of a laser diode due to diffusion bonding.

FIG. 5 illustrates the increase in lifetime of semiconductor junction devices (such as, laser diodes) as a result of the lower device stress obtained by diffusion bonding the device directly onto the heat-sink. (The graph exhibiting longest lifetime corresponds to bonding the device to the heatsink by the methods of these teachings.) A method of these teachings for increasing the lifetime of laser diodes or other semiconductor junction devices includes bonding the semiconductor junction device directly to the heat removal component using the methods described hereinabove.

It should be noted that the bonding (attachment) operation does not have to take place in a vacuum chamber or in an inert atmosphere. It should also be noted that the semiconductor component and the metallized substrate do not have to be crystals.

For the purposes of describing and defining the present invention it is noted that the terms "substantially" and "about" are utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although these teachings has been described with respect to various embodiments, it should be realized these teachings is also capable of a wide variety of further and other embodiments within the spirit and scope of the appended claims.

What is claimed is:

1. A method for attaching a semiconductor component to a metallized substrate, the method comprising the steps of:
    disposing a first thin film of malleable metal onto a top surface of the metallized substrate;
    disposing the semiconductor component on the first thin film of malleable metal, thereby forming a structure;
    applying a predetermined pressure and providing a predetermined quantity of heat to the structure for a predetermined period of time; the predetermined quantity of heat resulting in a temperature that is above room temperature but below the lowest melting temperature of materials utilized; the predetermined pressure causing plastic deformation of the malleable metal;
    whereby the semiconductor component is attached to the metallized substrate.

2. The method of claim 1 further comprising the step of:
    disposing, before the step of applying a predetermined pressure and providing a predetermined quantity of heat, a second thin film of malleable metal on a top surface of the semiconductor component.

3. The method of claim 2 further comprising the step of:
    preparing the top surface of the semiconductor component, before disposing the second thin film.

4. A device comprising:
    a semiconductor component; and
    a metallized substrate;
    the semiconductor component being attached to the metallized substrate by the method of claim 3.

5. The method of claim 2 wherein the predetermined quantity of heat results in a temperature that is above room temperature but below the lowest melting temperature of materials utilized.

6. The method of claim 2 where organic contamination of the second thin film of malleable metal is removed by exposing the second thin film of malleable metal to ultra-violet (UV) light.

7. The method of claim 2 wherein the second thin film of malleable metal comprises gold.

8. The method of claim 2 wherein a length and width of the second thin film of malleable metal is at most equal to about a length and width of the semiconductor component.

9. A device comprising:
    a semiconductor component; and
    a metallized substrate;
    the semiconductor component being attached to the metallized substrate by the method of claim 2.

10. The method of claim 1 further comprising the step of:
    preparing the top surface of the metallized substrate, before the step of disposing a first thin film of malleable metal onto the top surface.

11. The method of claim 10 wherein the step of preparing the top surface of the metallized substrate comprises at least one step selected from machining the top surface in order to produce a desired geometry, polishing the top surface and depositing at least one thin metal layer selected from an adhesion promoting layer and a diffusion barrier.

12. A device comprising:
    a semiconductor component; and
    a metallized substrate;
    the semiconductor component being attached to the metallized substrate by the method of claim 10.

13. The method of claim 1 further comprising the step of:
    preparing a bottom surface of the semiconductor component, before the step of disposing the semiconductor component on the first thin film of malleable metal.

14. The method of claim 13 wherein the step of preparing the bottom surface comprises the step of depositing at least one thin metal layer selected from an adhesion promoting layer, a diffusion barrier and a bonding promoting layer.

15. The method of claim 13 wherein the step of preparing the bottom surface comprises the step of depositing a bonding promoting layer.

16. The method of claim 15 wherein the bonding promoting layer comprises gold.

17. A device comprising:
    a semiconductor component; and
    a metallized substrate;
    the semiconductor component being attached to the metallized substrate by the method of claim 15.

18. The method of claim 15 wherein the step of preparing the top surface comprises the step of depositing at least one thin metal layer selected from an adhesion promoting layer, a diffusion barrier and a bonding promoting layer.

19. A device comprising:
    a semiconductor component; and
    a metallized substrate;
    the semiconductor component being attached to the metallized substrate by the method of claim 13.

20. The method of claim 1 wherein metal in the first thin film of malleable metal has a value of Young's modulus less than about 30 GPa.

21. The method of claim 1 wherein the metallized substrate has a root-mean-square surface roughness of at most about 1000 Å.

22. The method of claim 1 wherein the metallized substrate has a curvature of at most about 2 m.

23. The method of claim 1 wherein the predetermined pressure is greater than about 1 MPa (0.1 kg/mm$^2$) and less than about 100 Mpa (10 kg/mm$^2$).

24. The method of claim 1 wherein the predetermined pressure is greater than about 2 MPa (0.2 kg/mm$^2$) and less than about 100 Mpa (10 kg/mm$^2$).

25. The method of claim 1 wherein the predetermined period of time is greater than about 1 second and less than about 30 minutes.

26. The method of claim 1 wherein the predetermined pressure and the predetermined quantity of heat are applied substantially simultaneously.

27. The method of claim 1 wherein the predetermined pressure is applied prior to applying the predetermined quantity of heat.

28. The method of claim 1 wherein the predetermined quantity of heat is applied prior to applying the predetermined pressure.

29. The method of claim 1 where organic contamination of the first thin film of malleable metal is removed by exposing the first thin film of malleable metal to ultra-violet (UV) light.

30. The method of claim 1 wherein the first thin film of malleable metal comprises indium.

31. The method of claim 1 wherein a length and width of the first thin film of malleable metal is greater than or equal to about a length and width of the semiconductor component.

32. The method of claim 1 wherein a thickness of the first thin film of malleable metal is equal to or greater than about five times a root-mean-square surface roughness of the metallized substrate.

33. A device comprising:
  a. a semiconductor component; and
  b. a metallized substrate;
  c. the semiconductor component being attached to the metallized substrate by the method of claim 1.

34. A method for increasing semiconductor junction component lifetime, the method comprising the step of:
  attaching the semiconductor junction component to a heat removal component, the attaching comprising the steps of:
    disposing a first thin film of malleable metal onto a top surface of the heat removal component;
    disposing the semiconductor junction component on the first thin film of malleable metal, thereby forming a structure;
    applying a predetermined pressure, the predetermined pressure causing plastic deformation of the first thin film of malleable metal and providing a predetermined quantity of heat to the structure for a predetermined period of time;
    whereby the semiconductor junction component is attached to the heat removal component.

35. The method of claim 34 wherein the attaching further comprises the step of:
  disposing, before the step of applying a predetermined pressure and providing a predetermined quantity of heat, a second thin film of malleable metal on a top surface of the semiconductor junction component.

36. The method of claim 34 wherein the attaching further comprises the step of:
  preparing the bottom surface of the semiconductor junction component, before the step of disposing the semiconductor junction component on the first thin film of malleable metal.

37. The method of claim 36 wherein the preparing comprises the step of:
  depositing at least one thin metal layer selected from an adhesion promoting layer, a diffusion barrier and a bonding promoting layer.

* * * * *